United States Patent
Modarres et al.

(10) Patent No.: US 8,610,549 B2
(45) Date of Patent: Dec. 17, 2013

(54) SYSTEMS AND METHODS FOR PROVIDING HAPTIC FEEDBACK AT MULTIPLE RESONANCE FREQUENCIES

(75) Inventors: Ali Modarres, Montreal (CA); Pedro Gregorio, Verdun (CA); Danny Grant, Laval (CA)

(73) Assignee: Immersion Corporation, San Jose, CA (US)

( * ) Notice: Subject to any disclaimer, the term of this patent is extended or adjusted under 35 U.S.C. 154(b) by 1076 days.

(21) Appl. No.: 12/580,375

(22) Filed: Oct. 16, 2009

(65) Prior Publication Data
US 2011/0090070 A1   Apr. 21, 2011

(51) Int. Cl.
*G08B 6/00* (2006.01)
(52) U.S. Cl.
USPC ......... 340/407.2; 310/367; 310/321; 310/329
(58) Field of Classification Search
USPC ................... 340/407.2; 310/367, 321, 329
See application file for complete search history.

(56) References Cited

U.S. PATENT DOCUMENTS

| | | | |
|---|---|---|---|
| 2,950,368 A | | 8/1960 | Londell, Jr. |
| 4,897,541 A | * | 1/1990 | Phillips ............... 250/227.21 |
| 6,346,765 B1 | * | 2/2002 | Kikuchi et al. ............ 310/367 |
| 2004/0145281 A1 | * | 7/2004 | Kikuchi et al. ............ 310/367 |
| 2007/0075611 A1 | * | 4/2007 | Kawashima ............... 310/361 |
| 2008/0129415 A1 | * | 6/2008 | Iwai ......................... 333/188 |
| 2008/0143450 A1 | | 6/2008 | Matsumoto et al. |
| 2009/0102327 A1 | * | 4/2009 | Kawashima ............... 310/370 |
| 2009/0235747 A1 | * | 9/2009 | Sarrazin et al. ............. 73/579 |

FOREIGN PATENT DOCUMENTS

| | | |
|---|---|---|
| GB | 2427014 A | 8/2008 |
| WO | WO 2009/117125 A1 | 9/2009 |

OTHER PUBLICATIONS

International Preliminary Report on Patentability mailed Apr. 26, 2012 for corresponding International Patent Application No. PCT/US2010/049553.

International Search Report and Written Opinion mailed Mar. 2, 2011 for corresponding International Application No. PCT/US2010/049553.

* cited by examiner

*Primary Examiner* — Daryl Pope
(74) *Attorney, Agent, or Firm* — Kilpatrick Townsend & Stockton LLP

(57) ABSTRACT

Systems and methods for providing haptic feedback at multiple resonance frequencies are disclosed. For example, one disclosed apparatus includes a resonator with a base and a plurality of projections, a first projection of the plurality of projections having a first resonance frequency and a second projection of the plurality of projections having a second resonance frequency, and a piezoelectric actuator coupled to the resonator and operable to output a haptic feedback effect at the first resonance frequency and at the second resonance frequency.

20 Claims, 8 Drawing Sheets

SYSTEMS AND METHODS FOR PROVIDING HAPTIC FEEDBACK AT MULTIPLE RESONANCE FREQUENCIES

FIELD OF THE INVENTION

The present invention generally relates to haptic feedback, and more particularly to systems and methods for providing haptic feedback at multiple resonance frequencies.

BACKGROUND

A haptic feedback system vibrating at its resonance frequency may offer several advantages, including enhanced haptic feedback effects and/or more efficient power usage. Conventional haptic feedback systems may utilize multiple actuators each outputting a vibration at a different resonance frequency to achieve a system with multiple resonance frequencies. Using multiple actuators, however, may add weight, use more power, and cost more than other haptic feedback systems. Accordingly, there is a need for systems and methods for providing haptic feedback at multiple resonance frequencies.

SUMMARY

Embodiments of the present invention provide systems and methods for providing haptic feedback at multiple resonance frequencies. For example, in one embodiment, an apparatus for providing haptic feedback at multiple resonance frequencies comprises a resonator comprising a base and a plurality of projections, a first of the plurality of projections having a first resonance frequency and a second of the plurality of projections having a second resonance frequency different from the first resonance frequency, and a piezoelectric actuator coupled to the resonator and operable to output a haptic effect at the first resonance frequency and at the second resonance frequency.

Another embodiment comprises a computer implemented method providing haptic feedback at multiple resonance frequencies comprising the steps of receiving an input signal, determining a haptic feedback effect based at least in part on the input signal, selecting at least one projection of a plurality of projections of a resonator with which to output the haptic feedback effect based at least in part on a resonance frequency of the at least one projection, and generating a haptic signal configured to cause a piezoelectric actuator coupled to the resonator to generate a haptic feedback effect at the resonance frequency. A further embodiment of the present invention comprises a computer-readable medium having program code for executing such a computer-implemented method.

These illustrative embodiments are mentioned not to limit or define the invention, but to provide examples to aid understanding thereof. Illustrative embodiments are discussed in the Detailed Description, and further description of the invention is provided there. Advantages offered by various embodiments of this invention may be further understood by examining this specification.

BRIEF DESCRIPTION OF THE DRAWINGS

These and other features, aspects, and advantages of the present invention are better understood when the following Detailed Description is read with reference to the accompanying drawings, wherein.

DETAILED DESCRIPTION

Figure 1:
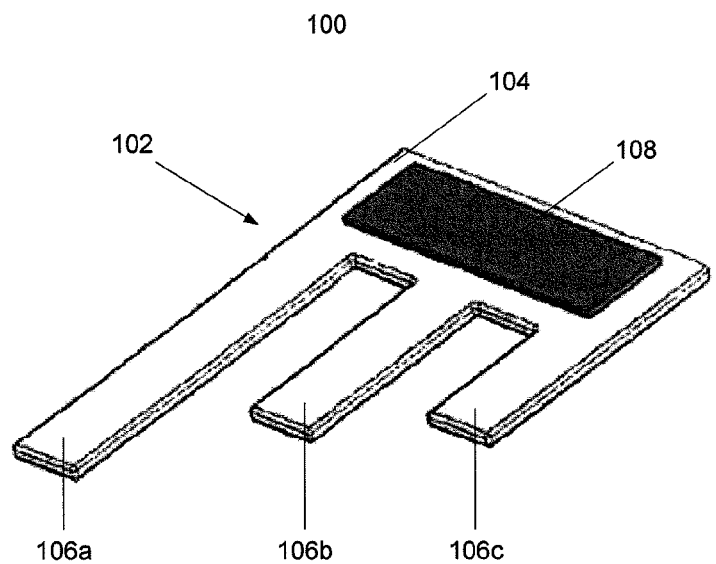
FIG. 1 is a perspective view of an apparatus for providing haptic feedback at multiple resonance frequencies according to one embodiment of the present invention.

Embodiments of the present invention provide systems and methods for providing haptic feedback at multiple resonance frequencies.

Illustrative Multi-Resonance Frequency Device

One illustrative embodiment of the present invention comprises a mobile device, such as a mobile phone. In the illustrative embodiment, the messaging device comprises the Samsung SGH-i710 mobile computer equipped with Immersion Corporation's TouchSense® 300 vibrotactile feedback system, previously know as Immersion Corporations VibeTonz® vibrotactile feedback system. Other messaging devices and haptic feedback systems may be utilized.

The mobile device comprises a touch-screen display, local memory, and a processor in communication with each of these elements. The illustrative mobile device also comprises a resonator and a piezoelectric actuator coupled to the resonator and in communication with the processor. The piezoelectric actuator is configured to receive a signal from the processor and output a haptic effect using the resonator.

In the illustrative device, the resonator is a multi-pronged metal plate or a metal sheet. The resonator comprises a base and two projections—a first projection and a second projection. Each of the projections extends from the base as a cantilevered beam. And each projection comprises at least one physical property, such as a shape, a length, a width, a thickness, a surface, a material composition, or a material coating. The resonance frequency of each projection is dependent on the physical property or properties of the projection. For example, a first projection having a first physical property that is different from a second physical property associated with a second projection may have a different resonance frequency. For example, if the first projection has a different length than a second projection, the two projections will also likely have a different resonance frequency than the first projection.

In the illustrative device, a piezoelectric actuator is coupled to the base of the resonator and configured to generate a haptic feedback effect at the resonance frequencies of each of the projections. For example, current may be applied so that a vibration is imparted in the piezoelectric actuator at the resonance frequency of the projection to be affected.

The piezoelectric actuator is in communication with the processor, which generates a haptic signal and transmits the haptic signal to the piezoelectric actuator. The haptic signal causes the piezoelectric actuator to generate a haptic feedback effect by vibrating the resonator. In the illustrative device, some part of the resonator is in contact with the housing or the display of the mobile device. As the piezoelectric actuator vibrates, a free end of the at least one projection bends or flexes up and down, causing the housing or display to vibrate. In other embodiments, the apparatus may provide haptic feedback effects to other parts of the mobile device, such as a button.

When the piezoelectric actuator vibrates at a resonance frequency of the projection in communication with the display, the display outputs an enhanced haptic feedback effect. The effect is enhanced since while operating at a resonance frequency of one of the projections, the piezoelectric actuator requires less power for a given displacement of a projection. So if the same power is applied, the effect is amplified or enhanced. Because each projection may have a different resonance frequency, the apparatus may be configured to generate a plurality of enhanced haptic effects corresponding to each different resonance frequency.

This illustrative example is given to introduce the reader to the general subject matter discussed herein. The invention is not limited to this example. The following sections describe various additional embodiments and examples of systems and methods for providing haptic feedback at multiple resonance frequencies.

Illustrative Systems for Multiple Resonance Frequency Devices for Haptic Effects Embodiments of the invention presented herein provide systems and methods for providing haptic feedback at multiple resonance frequencies. The frequency of haptic feedback effects plays an important role in the character, perception, and distinctiveness of a haptic feedback effect. By vibrating at different frequencies, an actuator may provide a variety of haptic feedback effects that are felt or perceived differently than each other. When an actuator vibrates at a resonance frequency of a coupled resonator, the haptic feedback effect may be stronger (i.e. have a greater amplitude) while requiring less power consumption. Thus, by using systems and methods for providing haptic feedback at multiple resonance frequencies, haptic feedback devices may provide a variety of enhanced feedback effects.

Illustrative Resonators

Referring now to the drawings in which like numerals indicate like elements throughout the several Figures, FIG. 1 is a perspective view of an apparatus for providing haptic feedback at multiple resonance frequencies according to one embodiment of the present invention. As shown in FIG. 1, the apparatus 100 comprises a resonator 102 and a piezoelectric actuator 108 coupled to a surface of the resonator 102.

The resonator 102 comprises a base 104 and a plurality of projections 106a, 106b, and 106c extending from or coupled to the base 104. In the embodiment shown, the base 104 and projections 106 for a single monolithic resonator 102. In other embodiments, the projections 106 may be separate structures affixed to the base 104. The base 104 and/or one or more of the plurality of projections 106a, 106b, and 106c may be configured to generate haptic feedback effects. For example, one or more of the plurality of projections 106a, 106b, and 106c may be in communication with a housing of a haptic feedback device (not shown in FIG. 1). When one or more of the projections 106a, 106b, 106c vibrate, the housing of the haptic feedback device may output a haptic feedback effect, such as a vibration. In other variations, the base 104 and/or one or more of the plurality of projections 106a, 106b, and 106c are in communication with a keypad, a touchpad, a display, and/or other parts of a haptic feedback device, which output a haptic feedback effect.

The resonator 102 may comprise a rigid or semi-rigid metal plate, such as an aluminum plate or a steel plate. Alternatively, the resonator 102 may comprise other materials, such as a flexible or semi-flexible plastic. In one variation, the resonator 102 comprises a substrate coated with one or more materials. For example, the resonator 102 may comprise a copper substrate laminated with a silicon polymer. The resonator 102 may be composed of a material which can be vibrated or flexed by the actuator 108. The shape and/or the material composition of the resonator 102 may be selected to effectively integrate into a variety of haptic feedback devices.

The apparatus 100 also comprises a piezoelectric actuator 108 coupled to the resonator 102 and configured to generate a haptic feedback effect. The piezoelectric actuator 108 may be coupled to the base via a polymer matrix, such as silicon, an epoxy resin, or some other means. Or the piezoelectric actuator may be coupled to the base 104 via a mechanical means, such as with screws. The piezoelectric actuator may be bonded to the base 104 and configured to flex and generate vibrations across the entire resonator 102.

In some embodiments, (not shown in FIG. 1) the piezoelectric actuator may be embedded within a flexible bonding material. The flexible bonding material may have a specific stiffness and damping ratio, and may also allow movement in an additional degree of freedom. In such an embodiment, the additional degree of freedom and the stiffness and damping ratio may allow the system to operate at additional resonant frequencies. In some embodiments, the present invention may use these additional resonant frequencies to generate additional haptic effects.

In FIG. 1, the piezoelectric actuator 108 is shown coupled to a first surface of the base 104 of the resonator 102. In another variation, the piezoelectric actuator 108 is coupled to a second surface of the base 104 of the resonator 102. The surfaces may be the top or bottom or the front and back or another configuration depending on the orientation of the resonator 102 in relation to the user. Or a first piezoelectric actuator can be coupled to the first surface of the base 104, and a second piezoelectric actuator can be coupled to the second surface of the base 104. In still other variations, a plurality of piezoelectric actuators 108 may be coupled to the top and/or the bottom of the base 104.

The piezoelectric actuator 108 may be in communication with a processor (not shown in FIG. 1). The processor may be configured to determine a haptic feedback effect and to determine a resonance frequency of at least one of a plurality of projections 106a, 106b, 106c of the resonator 102. Additionally, the processor may be configured to generate a haptic signal to the piezoelectric actuator 108, the haptic signal configured to cause the piezoelectric actuator 108 to generate a haptic feedback effect at a resonance frequency of a projection 106a, 106b, or 106c.

The piezoelectric actuator 108 may be configured to generate a haptic feedback effect at each one of the plurality of resonance frequencies of the plurality of projections 106a, 106b, 106c. One or more of the projections 106a, 106b, 106c may be in communication with a haptic feedback device (not shown in FIG. 1). The projections 106a, 106b, 106c may generate a haptic feedback effect on the haptic feedback device by flexing up and down in response to movements by the piezoelectric actuator 108.

The resonator 102 has a first projection 106a, a second projection 106b, and a third projection 106c. As shown in FIG. 1, each projection 106a, 106b, 106c is affixed to the base 104 and extends from the base 104. In one variation, the projections comprise a different material than the base 104, and are attached to the base 104 via a coupling means, such as an epoxy resin. Each projection 106a, 106b, 106c comprises a resonance frequency based at least in part on at least one physical property of the projection. A physical property may comprise a length, a width, a thickness, a surface, a composition, a coating, and/or a shape. For example, the first projection 106a is a flat rectangle with a first length and a first width. A first resonance frequency of the first projection 106a is based at least in part on the first length and the first width.

Each projection 106a, 106b, 106c has at least one physical property. The first projection 106a has a first length and a first width, the second projection 106b has a second length and a second width, and the third projection 106c has a third length and a third width. As shown in FIG. 1, each projection 106a, 106b, 106c comprises at least one different physical property: the first length of the first projection 106a is longer than the second length of the second projection 106b, and the second length of the second projection 106b is longer than the third length of the third projection 106c. Because the first projection 106a, the second projection 106b, and the third projection 106c comprise at least one different physical property, each projection 106a, 106b, 106c comprises a different resonance frequency. The resonance frequency of the first projection 106a is different than the resonance frequency of the second projection 106b because, at least in part, the first length is different than the second length. The resonance frequency of the second projection 106b is different than the resonance frequency of the third projection 106c because, at least in part, the second length is different than the third length.

Because the projections 106a, 106b, 106c have different resonance frequencies, each one of the projections may produce a different haptic feedback effect when the projection is vibrated at its resonance frequency. For example, a projection having a low resonance frequency may produce a low rumble when actuated at its resonance frequency. A projection having a high resonance frequency may produce many small vibrations when actuated at its resonance frequency.

In one embodiment, the resonance frequency of one projection may be a multiple of a resonance frequency of one or more other projections. For example, the first projection 106a may have a resonance frequency of 100 Hz, the second projection 106b may have a resonance frequency of 200 Hz, and the third projection 106c may have a resonance frequency of 400 Hz. In such an example, when the resonator 102 vibrates at 100 Hz, the first projection vibrates at its resonance frequency. When the resonator 102 vibrates at 200 Hz, both the first projection and the second projection vibrate at the resonance frequency of each projection. And when the resonator 102 vibrates at 400 Hz, each projection vibrates at its resonance frequency. Such an apparatus may be configured to layer and multiply haptic effects on top of each other in certain embodiments, for example to combine a low rumble haptic feedback effect with a high vibration haptic feedback effect.

In other embodiments, the resonance frequency of a first projection may not be an integer multiple of a resonance frequency of any other projection. For instance, one apparatus may comprise a first projection with a first resonance frequency of 29 Hz, a second projection with a second resonance frequency of 37 Hz, and a third projection with a third resonance frequency of 53 Hz. When each projection has a resonance frequency that is a prime number and/or not a multiple of a resonance frequency of any of the other projections, only one projection may vibrate at its resonance frequency at one time. Such an apparatus may be configured to isolate specific feedback effects, for example, to maximize a specific type of haptic feedback effect at one time.

The projections 106a, 106b, 106c are shown as rectangles with a flat, regular surface and a uniform thickness. In other embodiments, the projections may comprise different lengths, widths, thicknesses, shapes, surface characteristics, and/or other physical properties. For example, in one variation, a resonator may comprise a first oval-shaped projection, a second circle-shaped projection, and a third square-shaped projection. In another variation, a first projection may have a smooth, flat surface, while a second projection may have a surface comprising a plurality of bumps and/or ridges, or the surface may define a hole. The physical properties of a projections can affect the resonance frequency of a projection. Thus, as the length or the composition or other physical property of two projections varies, so does the resonance frequency of each.

In some embodiments, the resonator 102 comprises a uniform substance—that is, the base 104 and the projections 106a, 106b, 106c comprise the same substance. In another variation the base 104 and the projections 106a, 106b, 106c comprise a different substance. For example, the base 104 may comprise plastic substance, while the projections 106a, 106b, 106c comprise a metallic substance. In yet another variation, each projection is coated with a different substance. A variation in substance may result in a variation in the resonance frequency. For example, a first projection may be coated with an epoxy resin, and have a first thickness. A second projection may be coated in a polymer matrix, such as silicon, and have a second thickness different than the first thickness. And a third projection may be uncoated, and have a third thickness different than the first thickness and the second thickness.

Although the first length of the first projection 106a, the second length of the second projection 106b, and the third length of the third projection 106c are shown as different lengths in FIG. 1, in other embodiments, two or more of the projections of the resonator 102 may comprise the same length. The resonator 102 of the apparatus 100 comprises three projections 106a, 106b, 106c. In other embodiments, the resonator may comprise two, three, or more projections.

Figure 2:
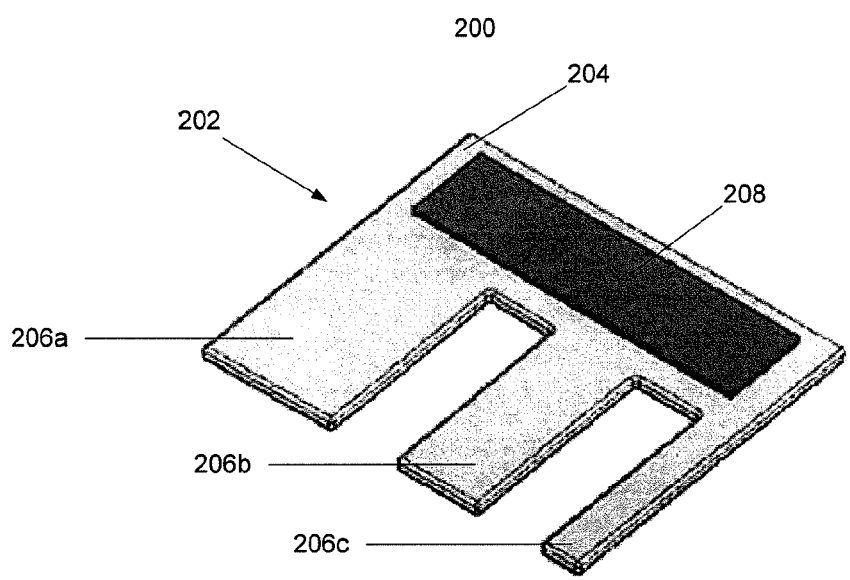
FIG. 2 is a perspective view of an apparatus for providing haptic feedback at multiple resonance frequencies according to one embodiment of the present invention.

FIG. 2 is a perspective view of an apparatus for providing haptic feedback at multiple resonance frequencies according to one embodiment of the present invention. As illustrated in FIG. 2, the apparatus 200 comprises a resonator 202 and a piezoelectric actuator 208.

As shown in FIG. 2, the resonator 202 comprises a base 204 and a plurality of projections 206a, 206b, and 206c. Each projection 206a, 206b, 206c has at least one physical property. The first projection 206a comprises a first width. The second projection 206b comprises a second width. The third projection 206c comprises a third width. As shown in FIG. 2, each of the plurality of projections 206a, 206b, 206c comprises at least physical property different than a physical property of the other projections. In FIG. 2, the first width of the first projection 206a is wider than the second width of the second projection 206b. The second width of the second projection 206b is wider than the third width of the third projection 206c. Each projection 206a, 206b, 206c has a different resonance frequency based at least in part on the different width of each projection 206a, 206b, 206c.

The apparatus 200 also comprises a piezoelectric actuator 208 configured to generate a haptic feedback effect. The piezoelectric actuator 208 is coupled to a first surface of the base 204 of the resonator 202. Although not shown in FIG. 2, one or more piezoelectric actuators may be coupled to a second surface of the base 204. The piezoelectric actuator 208 may be configured to generate a haptic feedback effect at each one of the plurality of resonance frequencies of the plurality of projections 206a, 206b, 206c.

Figure 3:
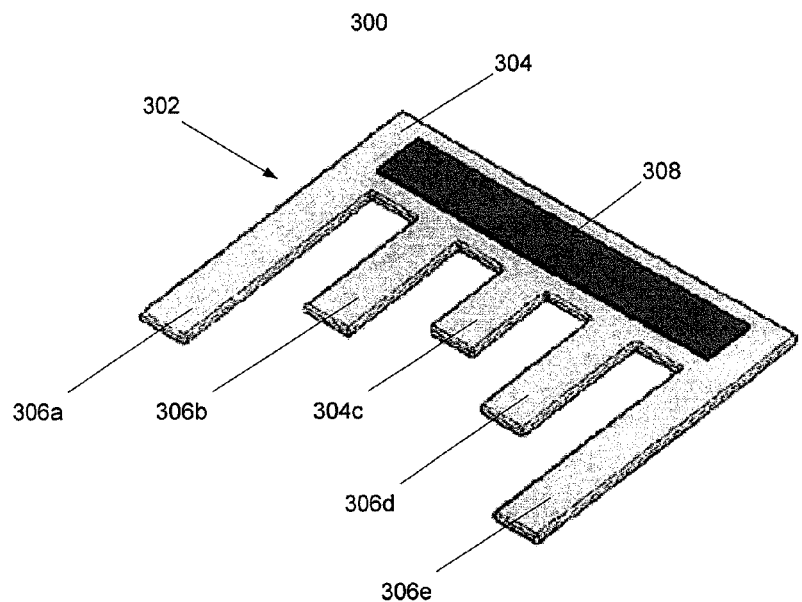
FIG. 3 is a perspective view of an apparatus for providing haptic feedback at multiple resonance frequencies according to one embodiment of the present invention.

FIG. 3 is a perspective view of an apparatus for providing haptic feedback at multiple resonance frequencies according to one embodiment of the present invention. As shown in FIG. 3, the apparatus 300 comprises a resonator 302 and a piezoelectric actuator 308. The resonator 302 comprises a base 304, a first projection 306a, a second projection 306b, a third projection 306c, a fourth projection 306d, and a fifth projection 306e.

The resonator 302 is shown in a symmetric configuration. Physical properties of the first projection 306a, such as the length, width, and shape of the first projection 306a, mirror the same physical properties of the fifth projection 306e. Additionally, physical properties of the second projection 306b, such as the length, width, and shape of the second projection 306b, mirror the same physical properties of the fourth projection 306d. A symmetrical resonator 302 may be easier to design and/or manufacture. In some variations, a symmetrical resonator 302 may provide more balanced haptic feedback effects across a haptic feedback device than a non-symmetrical resonator.

The first projection 306a has a first length and a first width; the second projection 306b has a second length and a second width; the third projection 306c has a third length and a third width; the fourth projection 306d has a fourth length and a fourth width; and the first projection 306e has a fifth length and a fifth width. As shown in FIG. 3, each projection 306a, 306b, 306c, 306d, 306e has the same width. That is, the first width, the second width, the third width, the fourth width, and the fifth width are the same. However, because not all of the physical properties of each projection 306a, 306b, 306c, 306d, 306e are the same, the resonance frequencies of the projections 306a, 306b, 306c, 306d, 306e are not all the same.

Since the first length of the first projection 306a is equal to the fifth length of the fifth projection 306e, the resonance frequency of the first projection 306a is equal to the resonance frequency of the fifth projection 306e, assuming all of the other physical properties of the projects are the same. Similarly, since the second length of the second projection 306b is equal to the fourth length of the fourth projection 306d, the resonance frequency of the second projection 306b is equal to the resonance frequency of the fourth projection 306d. In contrast, since the third length of the third projection 306c is not the same as the first, second, fourth, or fifth length, the resonance frequency of the third projection 306c is not the same as the resonance frequency of these other projections first projection 306a, 306b, 306d, and 306e.

The apparatus 300 also comprises a piezoelectric actuator 308 coupled to a top of a base 304 of the resonator 302. In one embodiment, a plurality of actuators are coupled to opposing surface of the base 304. The piezoelectric actuator 308 is configured to generate a haptic feedback effect. For example, the piezoelectric actuator 308 may vibrate the resonator 302 at the resonance frequency of the second projection 306b and the fourth projection 306d. The apparatus, including the second projection 306b and the fourth projection 306d, may then generate enhanced haptic feedback effects.

Figure 4:
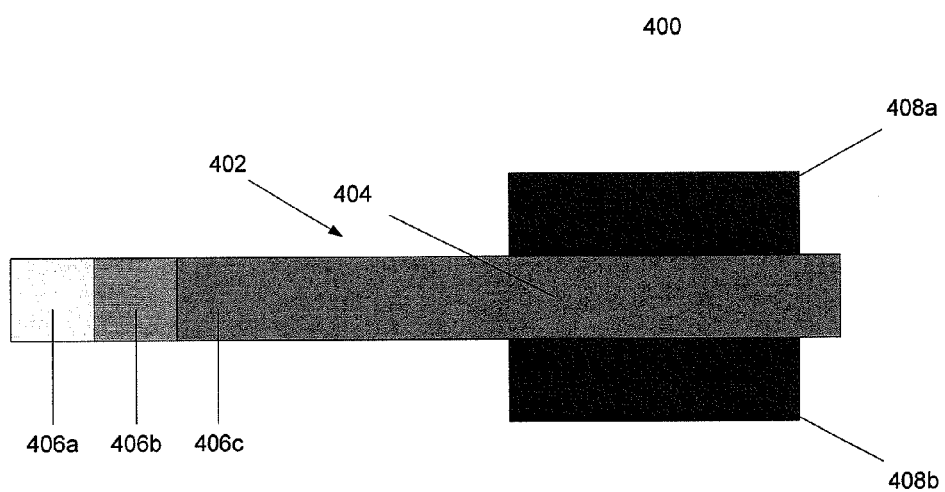
FIG. 4 is a side view of an apparatus for providing haptic feedback at multiple resonance frequencies according to one embodiment of the present invention.

FIG. 4 is a side view of an apparatus for providing haptic feedback at multiple resonance frequencies according to one embodiment of the present invention. As shown in FIG. 4, the apparatus 400 comprises a resonator 402, a top piezoelectric actuator 408a, and a bottom piezoelectric actuator 408b. The resonator 402 comprises a base 404, a first projection 406a, a second projection 406b, and a third projection 406c.

The first projection 406a has a first length and a first thickness; the second projection 406b has a second length and a second thickness; and the third projection 406c has a third length and a third thickness. As shown in FIG. 4, each projection 406a, 406b, 406c comprises the same thickness, i.e., the first thickness, the second thickness, and the third thickness are the same. However, because each projection 406a, 406b, 406c comprises a different length, each projection 406a, 406b, 406c comprises a different resonance frequency. The resonance frequency of the first projection 406a is different than the resonance frequency of the second projection 406b based at least in part on the difference between the first length and the second length. The resonance frequency of the second projection 406b is different than the resonance frequency of the third projection based at least in part on the difference between the second length and the third length.

The apparatus 400 also comprises a first piezoelectric actuator 408a coupled to a top of a base 404 of the resonator 402, and a second piezoelectric actuator 408b coupled to a bottom of the base 404 of the resonator 402. Both the first piezoelectric actuator 408a and the second piezoelectric actuator 408b may be configured to provide haptic feedback effects. For example, the piezoelectric actuators 408a, 408b may cause one or more of the projections 406a, 406b, 406c to bend or flex up and down. When the piezoelectric actuators 408a, 408b vibrate at a resonance frequency of at least one of the projections 406a, 406b, 406c, the apparatus 400 may generate enhanced haptic feedback effects. In some embodiments, piezoelectric actuators 408a and 408b may be embedded within a flexible bonding material. In some embodiments, the flexible bonding material may act as an interface between the piezoelectric actuator and the base. The flexible bonding material may have a specific stiffness and damping ratio, and may also allow movement in an additional degree of freedom. In such an embodiment, the additional degree of freedom and the stiffness and damping ratio may allow the system to operate at additional resonant frequencies. In some embodiments, the present invention may use these additional resonant frequencies to generate additional haptic effects. In some embodiments, the flexible bonding material may comprise a polymer matrix such as epoxy.

Figure 5:
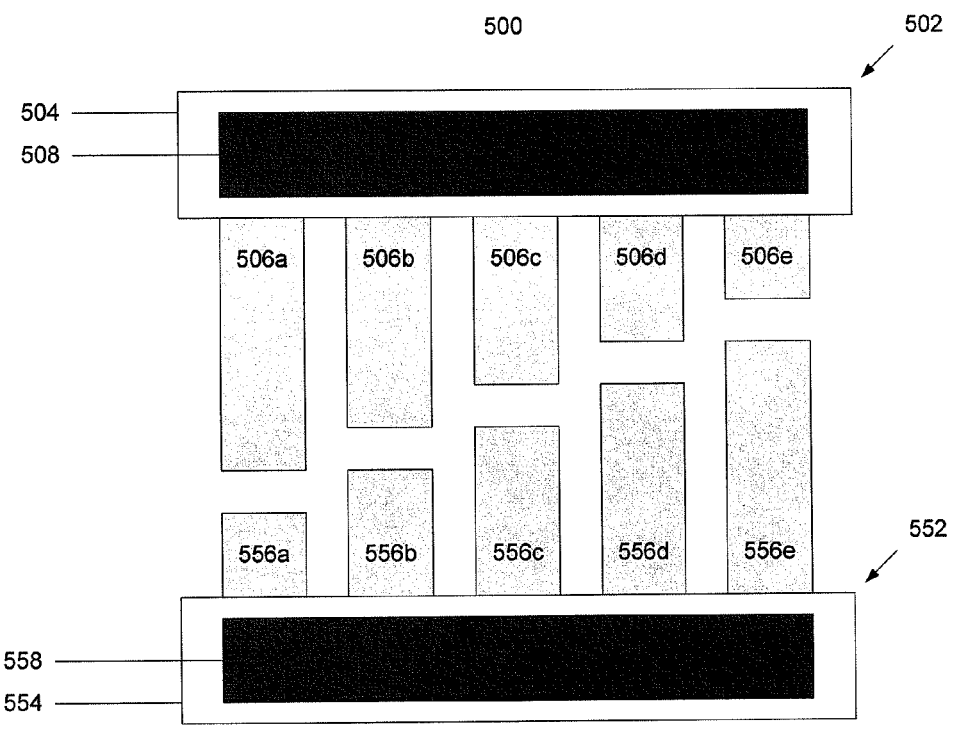
FIG. 5 is a top view of an apparatus for providing haptic feedback at multiple resonance frequencies according to one embodiment of the present invention.

In some configurations, a first apparatus for multiple resonance frequency may be positioned in a complimentary arrangement with a second apparatus for multiple resonance frequency. FIG. 5 is a top view of an apparatus for providing haptic feedback at multiple resonance frequencies according to one embodiment of the present invention. As shown in FIG.

5, the apparatus 500 comprises a first resonator 502 with a first piezoelectric actuator 508, and a second resonator 552 with a second piezoelectric actuator 558. The resonator 502 comprises a base 504 and five projections 506a, 506b, 506c, 506d, and 506e. The resonator 552 also comprises a base 554 and five projections 556a, 556b, 556c, 556d, and 556e.

The resonator 502 is shown in a complimentary configuration with the resonator 552. By using a plurality of resonators 502, 552, haptic feedback effects may be enhanced. In one configuration, two or more projections may be configured to provide a haptic feedback effect to a particular component of a device, such as a particular button, a particular region of a display, or a particular section of a housing. For example, as shown in FIG. 5, projection 506a and projection 556a may be in communication with a first key of a housing. Both projection 506a and projection 556a may be configured to provide a haptic feedback effect to the first key. The longer projection 506a may have a high resonance frequency, and be configured to provide high frequency vibrations to the first key. The shorter projection 556b may have a low resonance frequency, and be configured to provide low frequency vibrations to the first key. Projection 506b and projection 556b may be in communication with a second key of the housing. In some embodiments (not shown in FIG. 5) the projections may not be in direct mechanical contact with the keys of the housing. In such an embodiment the resonant frequency may be transmitted through the air between the key and the projection.

In some embodiments, piezoelectric actuator 558 may be embedded within a flexible bonding material. The flexible bonding material may have a specific stiffness and damping ratio, and may also allow movement in an additional degree of freedom. In such an embodiment, the additional degree of freedom and the stiffness and damping ratio may allow the system to operate at additional resonant frequencies. In some embodiments, the present invention may use these additional resonant frequencies to generate additional haptic effects.

Figure 6:
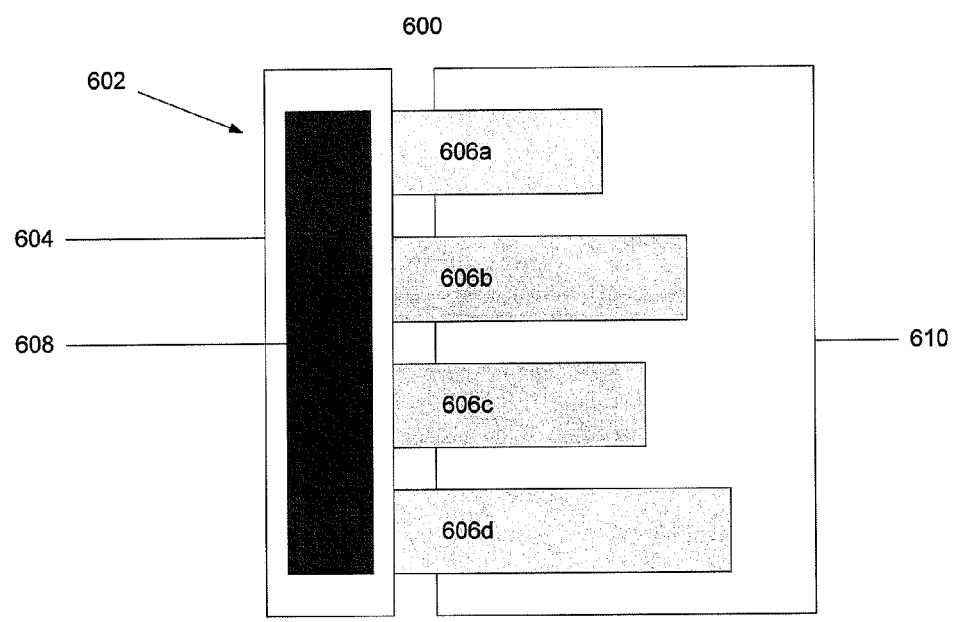
FIG. 6 is a top view of an apparatus for providing haptic feedback at multiple resonance frequencies according to one embodiment of the present invention.

FIG. 6 is a top view of an apparatus for providing haptic feedback at multiple resonance frequencies according to one embodiment of the present invention. As shown in FIG. 6, the apparatus 600 comprises a resonator 602 with a piezoelectric actuator 608 and a haptic feedback surface 610. The resonator 602 comprises a base 604, a first projection 606a, a second projection 606b, a third projection 606c, and a fourth projection 606d.

As shown in FIG. 6, the first projection 606a has a first length and a first width; the second projection 606b has a second length and a second width; the third projection 606c has a third length and a third width, and the fourth projection 606d has a fourth length and a fourth width. Each projection 606a, 606b, 606c, 606d shown in FIG. 6 has the same width. However, because each projection 606a, 606b, 606c, 606d is a different length, each projection 606a, 606b, 606c, 606d has a different resonance frequency. In one alternative, each projection 606a, 606b, 606c, 606d may be the same length, but comprise a different stiffness, and thus a different resonance frequency.

The projections 606a, 606b, 606c, 606d are each in communication with the haptic feedback surface 610. As shown in FIG. 6, the haptic feedback surface is positioned under each of the projections 606a, 606b, 606c, 606d. The haptic feedback surface 610 may comprise a touch-screen display, a keypad, keyboard, foot pad, or other surface configured to provide a haptic feedback effect. When the piezoelectric actuator 608 causes one or more of the projections 606a, 606b, 606c, 606d to vibrate, then the haptic feedback surface 610 may provide haptic feedback effects to a user. For example, the piezoelectric actuator 608 may cause the third projection 606c to vibrate or resonate at its resonance frequency. As the third projection 606c vibrates, the projection 606c may cause the haptic feedback surface 610 to output a haptic effect, such as a vibration.

Figure 7:
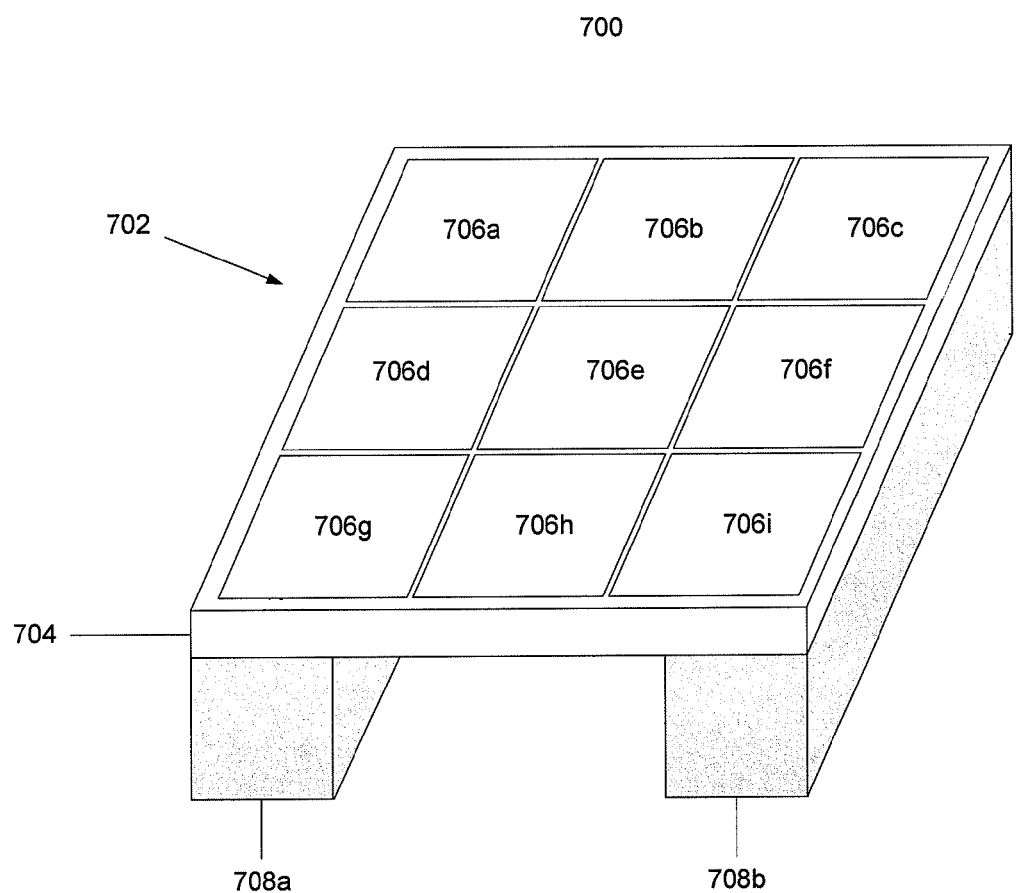
FIG. 7 is a perspective view of an apparatus for providing haptic feedback at multiple resonance frequencies according to one embodiment of the present invention.

FIG. 7 is a perspective view of an apparatus for providing haptic feedback at multiple resonance frequencies according to one embodiment of the present invention. As shown in FIG. 7, the apparatus 700 comprises a resonator 702, a first piezoelectric actuator 708a, and a second piezoelectric actuator 708b. The resonator 702 comprises a base 704 and nine projections 706a, 706b, 706c, 706d, 706e, 706f, 706g, 706h, 706i arranged in an array.

Each projection 706 comprises at least one physical property. In the illustration shown in FIG. 7, each projection 706 is attached or affixed to the base 704 with a different spring value. For instance, the spring value of the connection between the first projection 708a and the base 704 may be higher than the spring value of the connection between the second projection 706b and the base 704a, and higher still than the spring value of the connection between the third projection 706c and the base 704. Because each projection 708 is attached to the base 704 with a different spring value, each projection 706 may have a different resonance frequency. In another embodiment, the spring value of each projection 706 is the same, but each projection 706 comprises a different thickness.

The piezoelectric actuators 708 may actuate the base 704 at a resonance frequency of one of the projections 706. For example, the piezoelectric actuators 708 may actuate the base 704 at a resonance frequency of the fifth projection 706e. By actuating the base 704 at a resonance frequency of the fifth projection 706e, the fifth projection 706e may generate a targeted haptic feedback effect. In one variation, each projection 706 is in communication with a touch-screen display. When the piezoelectric actuators 708 actuate at a resonance frequency of one of the projections, the targeted projection generates a localized haptic feedback effect on the display corresponding to the position of the projection on the base 704.

Figure 8:
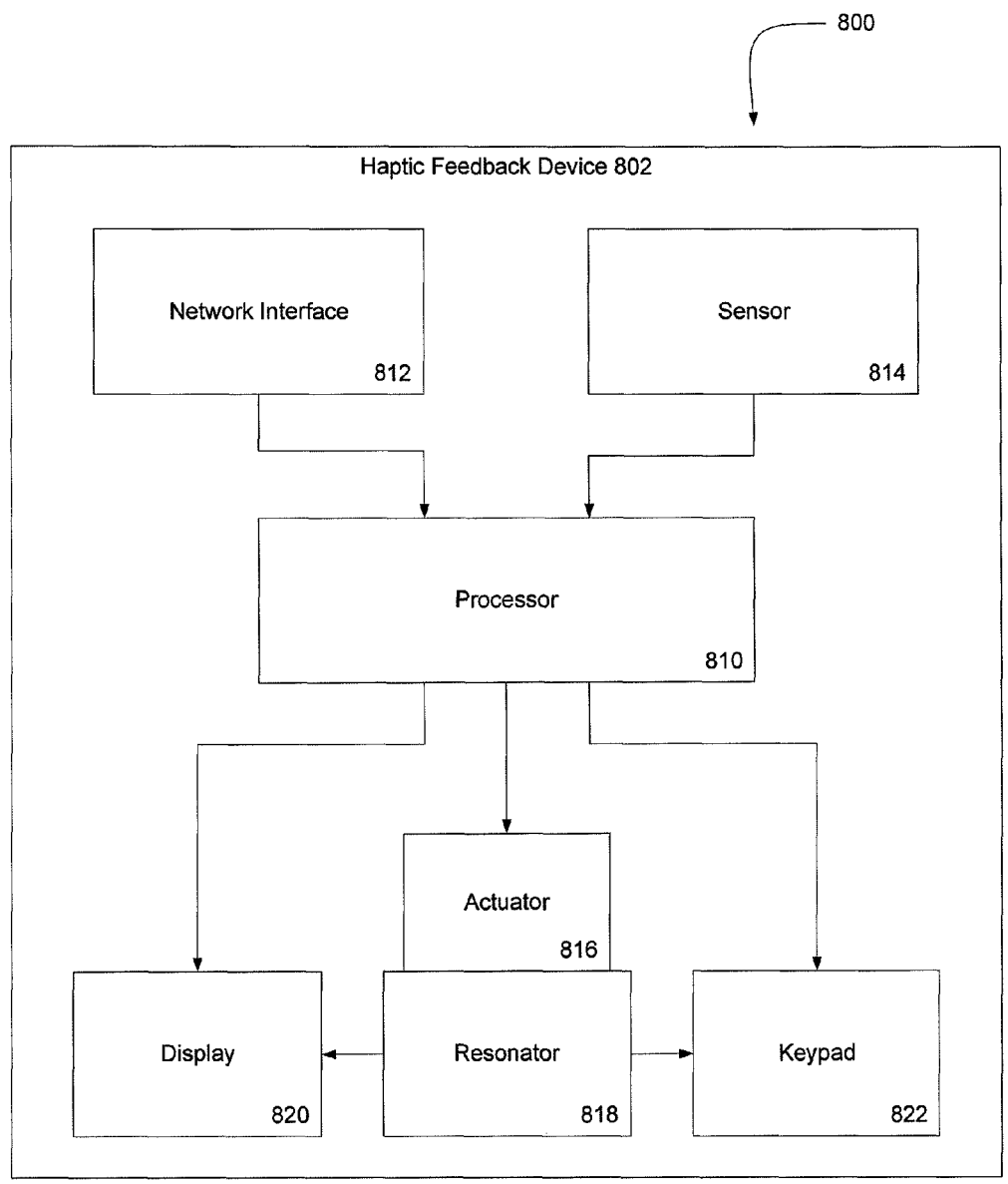
FIG. 8 is a block diagram of a system providing haptic feedback at multiple resonance frequencies according to one embodiment of the present invention.

FIG. 8 is a block diagram of a system providing haptic feedback at multiple resonance frequencies according to one embodiment of the present invention. The system 800 comprises a haptic feedback device 802, such as a mobile phone, mobile computer, personal digital assistant (PDA), portable media player, or portable gaming device. The haptic feedback device 802 comprises a processor 810 in communication with a network interface 812, a sensor 814, a display 820, and a keypad 822. The processor 510 is also in communication with a piezoelectric actuator 816 coupled to a resonator 518. The piezoelectric actuator 816 and the resonator 818 may provide haptic feedback effects to the display 820 and/or the keypad 822.

The processor 810 is in communication with the network interface 812. The network interface 812 may comprise one or more methods of mobile communication, such as infrared, radio, Wi-Fi or cellular network communication. In other variations, the network interface 812 comprises a wired network interface, such as Ethernet. The haptic feedback device 802 can be configured to exchange messages with other devices (not shown) over networks such as a cellular phone network and/or the Internet. Embodiments of messages exchanged between devices may comprise voice messages, text messages, data messages, or other forms of messages.

The processor 810 is also in communication with one or more sensors 814. The sensor 814 may comprise a location sensor, rotational velocity sensor, image sensor, pressure sensor, or other type of sensor. For example, sensor 814 may comprise an accelerometer, a gyroscope, a GPS sensor, a touch-sensitive input device (e.g. touch screen, touch-pad), or some other type of sensor. The one or more sensors 814 may be configured to detect changes in, for example, acceleration, inclination, inertia, or location. For example, the haptic feedback device 802 may comprise an accelerometer configured to measure acceleration of the haptic feedback device 802. As another example, the haptic feedback device 802 may comprise a location sensor, rotary velocity sensor, image sensor, pressure sensor, or other type of sensor. The one or more sensors 814 may be configured to send a sensor signal to the processor 810.

The processor 810 is in communication with a display 820 and a keypad 822. The display may comprise a touch-sensitive input device, such as a touch-screen. The actuator 816 and the resonator 818 may be configured to provide haptic feedback effects to the display 820 and/or the keypad 822. In other embodiments, the actuator 816 and the resonator 818 may provide haptic feedback effects to other parts of the haptic feedback device 802, such as a touch-pad (not shown in FIG. 8) and/or an off-activating area (not shown in FIG. 8).

The processor may determine a haptic feedback effect based at least in part on a sensor signal received from the sensor 814, a display signal received from the display 820, and/or an input signal received from the keypad 822. As one example, the processor may be generating a game shown on the display 820. When a virtual object is destroyed in the game, perhaps through some input received from the keypad 822 or touch-screen display 820, the processor may determine a haptic feedback effect imitating an explosion, such as a heavy rumble.

Figure 9:
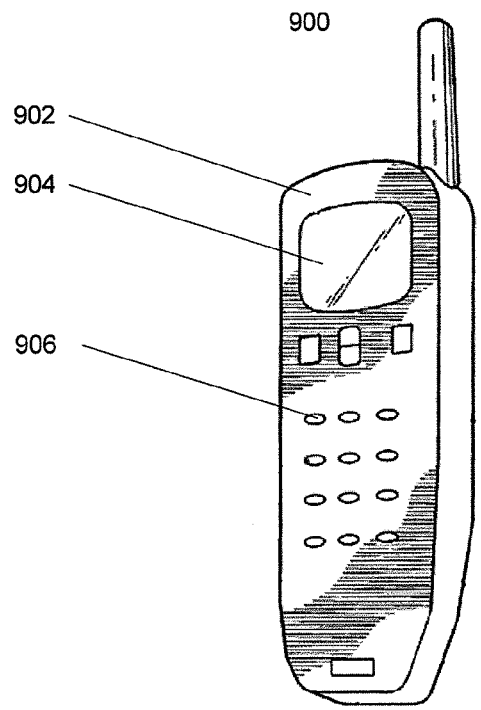
FIG. 9 is an illustration of a system providing haptic feedback at multiple resonance frequencies according to one embodiment of the present invention.

FIG. 9 is an illustration of a system providing haptic feedback at multiple resonance frequencies according to one embodiment of the present invention. The system 900 in FIG. 9 comprises a mobile phone. The mobile phone comprises a body 902, a display 904, and a keypad 906. The mobile phone also comprises a processor (not shown in FIG. 9) in communication with a piezoelectric actuator (not shown in FIG. 9). The piezoelectric actuator is coupled to a resonator (not shown in FIG. 9) in communication with the keypad 906.

The resonator may comprise a plurality of projections, each projection with a different resonance frequency, such as those described in various embodiments herein. The piezoelectric actuator and the resonator may be configured to generate haptic feedback effects on the keypad 906. When the piezoelectric actuator actuates the resonator at a resonance frequency of at least one of a plurality of projections of the resonator, then the at least one projection may generate enhanced haptic feedback effects, such as by bending or flexing with lower power consumption but increased strength.

Figure 10:
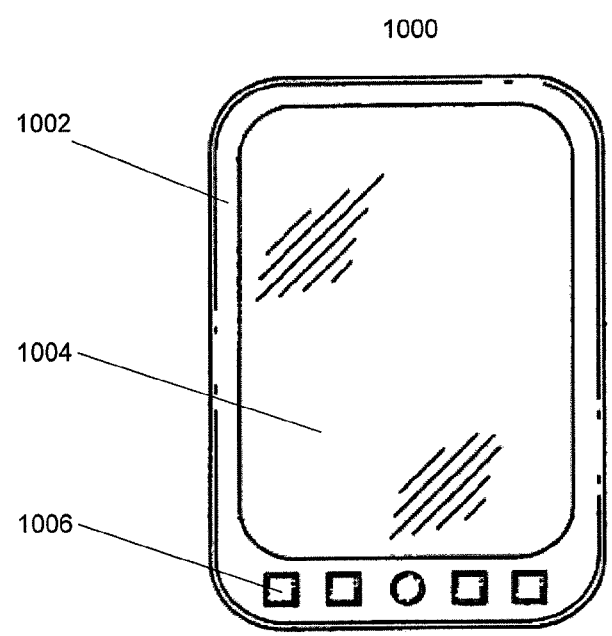
FIG. 10 is an illustration of a system providing haptic feedback at multiple resonance frequencies according to one embodiment of the present invention.

FIG. 10 is an illustration of a system providing haptic feedback at multiple resonance frequencies according to one embodiment of the present invention. The system 1000 in FIG. 10 comprises a mobile phone. The mobile phone comprises a body 1002, a touch-screen display 1004, and a keypad 1006. The mobile phone also comprises a processor (not shown in FIG. 10) in communication with a piezoelectric actuator (not shown in FIG. 10). The piezoelectric actuator is coupled to a resonator (not shown in FIG. 10) in communication with the touch-screen display 1004.

The piezoelectric actuator and the resonator may be configured to generate haptic feedback effects on the touch-screen display 1004. For example, when the piezoelectric actuator actuates the resonator and a plurality of projections at a resonance frequency of at least one of the plurality of projections, then the at least one projection may generate enhanced haptic feedback effects, such as by bending or flexing with lower power consumption but increased strength.

Figure 11:
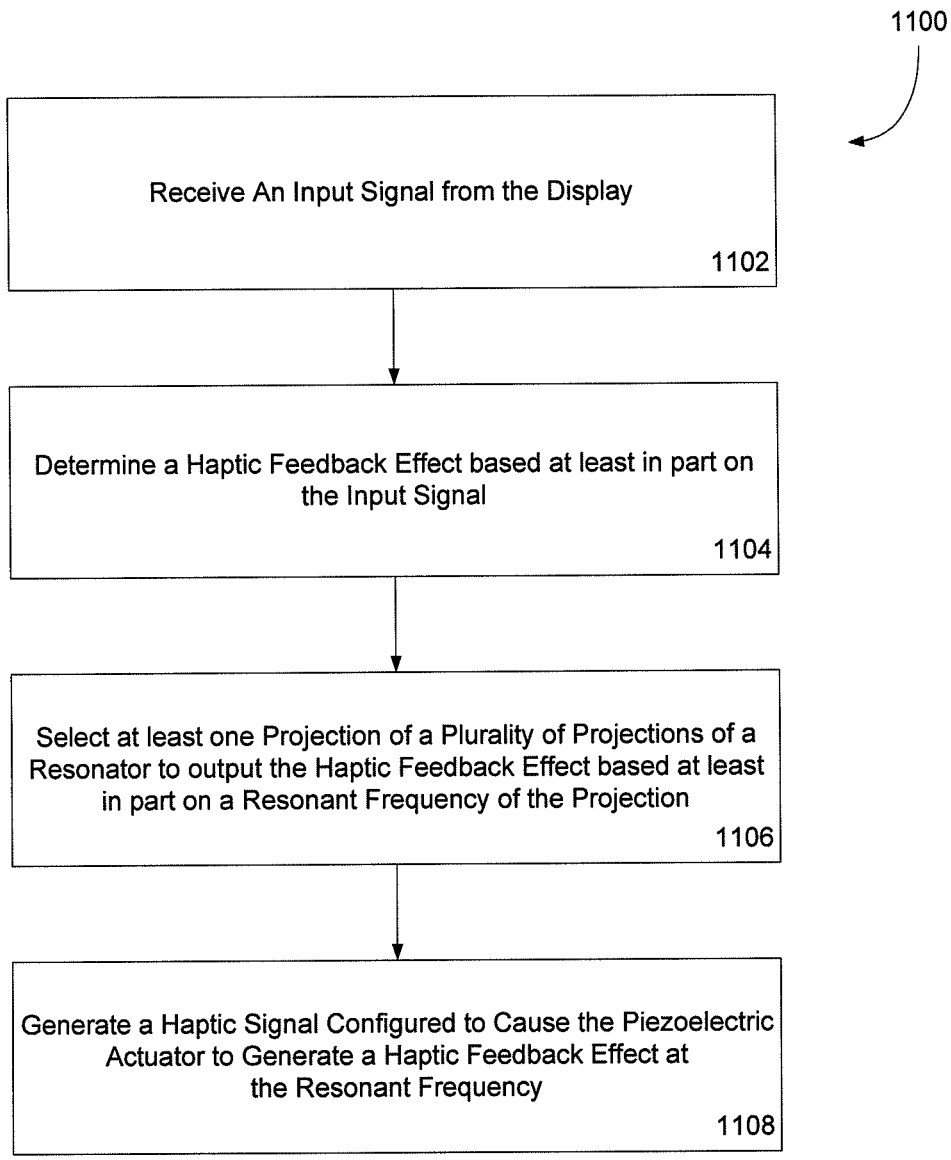
FIG. 11 is a flow diagram of a method providing haptic feedback at multiple resonance frequencies according to one embodiment of the present invention.

FIG. 11 is a flow diagram of a method providing haptic feedback at multiple resonance frequencies according to one embodiment of the present invention. The elements of the system 1100 are described with reference to the system depicted in FIG. 8. A variety of other implementations are possible. The method 1100 begins with the processor 810 receiving an input signal 1102. The processor 810 may receive the input signal from a touch-screen display 820, a keypad 822, a sensor 814, or from some other source. In one example, a user is playing a video game on the haptic feedback device 802. During game play, the user activates a button on the keypad 822 and the processor 820 receives an input signal from the keypad 822 associated with the button activation.

Next, the processor 810 determines a haptic feedback effect based at least in part on the input signal 1104. In one embodiment, an input signal received from a keypad 822 may be associated with an interaction on the display 820. The processor 810 may determine a haptic feedback effect simulating the interaction on the display 820. In one embodiment, the processor 810 selects a haptic feedback effect from a library of haptic feedback effects stored in a local memory.

Next, the processor 810 selects at least one projection of a plurality of projections of a resonator to output the haptic feedback effect based at least in part on a resonance frequency of the at least one projection 1106. The resonator 818 may comprise a plurality of projections, each projection having a different resonance frequency. The processor 810 may select which projection to output the haptic effect by determining which projection is best suited to output the haptic feedback effect. For example, the resonance frequencies of the projections may be stored in a lookup table or other data store in which the processor 810 searches for the resonance frequency associated with each projection. For example, if the processor 810 determines a haptic feedback effect such as a low, deep rumble, the processor 810 may select a projection having the lowest resonance frequency of the plurality of projections of the resonator 818. As another example, if the processor 810 determines a haptic feedback effect such as a light, fast tapping effect, the processor 810 may select the projection having the highest resonance frequency of the plurality of projections of the resonator 818.

Finally, the processor 810 generates a haptic signal configured to cause the piezoelectric actuator 816 to generate a haptic feedback effect at the resonance frequency 1108. After receiving a haptic signal, the piezoelectric actuator 816 may vibrate at a frequency associated with the haptic signal. By generating a haptic feedback effect at the resonance frequency of one of the projections, the vibration or bending of the projection may be stronger and/or more efficient than if the vibration was not at the resonance frequency of one of the projections. Thus, the haptic feedback effect at the resonance frequency of a projection may consume less power and/or be more amplified than a haptic feedback effect at a non-resonance frequency of a projection.

Figure 12:
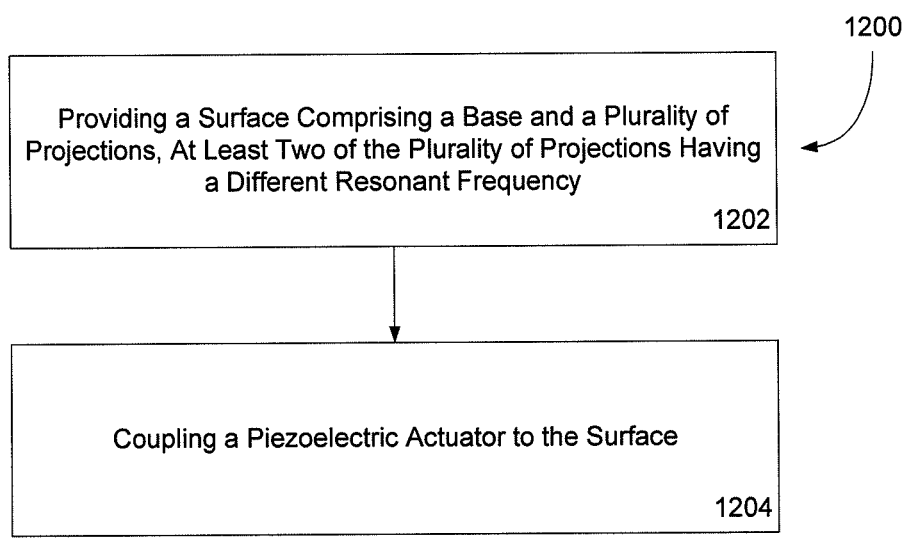
FIG. 12 is a flow diagram of a method providing haptic feedback at multiple resonance frequencies according to one embodiment of the present invention.

FIG. 12 is a flow diagram of a method providing haptic feedback at multiple resonance frequencies according to one embodiment of the present invention. The method 1200 begins with providing a resonator comprising a base and a plurality of projections, at least two of the plurality of projections having a different resonance frequency 1202. The resonator may comprise a symmetric configuration or an asymmetric configuration. In a symmetric configuration, a first half of the resonator may mirror a second half of the resonator. In one instance of a symmetric configuration, a resonator comprises two projections: a first projection may have the same size and shape as a second projection opposite the first projection. In an asymmetric configuration, a first projection may have a different size and/or shape than a second projection opposite the first projection.

Next, the method 1200 comprises coupling a piezoelectric actuator to the resonator 1204. The piezoelectric actuator may be coupled to the resonator via an epoxy resin, via mechanical means, or via some other method. One or more piezoelectric actuators may be coupled to the top of the resonator, and one or more piezoelectric actuators may be coupled to the top of the resonator.

Embodiments of the present invention can be implemented in combination with digital electronic circuitry, or in computer hardware, firmware, software, or in combinations of them. In one embodiment, a computer such as a mobile phone may comprise a processor or processors. The processor comprises a computer-readable medium, such as a random access memory (RAM) coupled to the processor. The processor executes computer-executable program instructions stored in memory, such as executing one or more computer programs for messaging. Such processors may comprise a microprocessor, a digital signal processor (DSP), an application-specific integrated circuit (ASIC), field programmable gate arrays (FPGAs), and state machines. Such processors may further comprise programmable electronic devices such as PLCs, programmable interrupt controllers (PICs), programmable logic devices (PLDs), programmable read-only memories (PROMs), electronically programmable read-only memories (EPROMs or EEPROMs), or other similar devices.

Such processors may comprise, or may be in communication with, media, for example, computer-readable media that may store instructions that, when executed by the processor, can cause the processor to perform the steps described herein as carried out, or assisted, by a processor. Embodiments of computer-readable media may comprise, but are not limited to, an electronic, optical, magnetic, or other storage or transmission device capable of providing a processor, such as the processor in a web server, with computer-readable instructions. Other examples of media comprise, but are not limited to, a floppy disk, CD-ROM, magnetic disk, memory chip, ROM, RAM, ASIC, configured processor, all optical media; all magnetic tape or other magnetic media, or any other medium from which a computer processor can read. Also, various other devices may include computer-readable media, such as a router, private or public network, or other transmission device. The processor, and the processing, described may be in one or more structures, and may be dispersed through one or more structures. The processor may comprise code for carrying out one or more of the methods (or parts of methods) described herein.

GENERAL

The foregoing description of the embodiments, including preferred embodiments, of the invention has been presented only for the purpose of illustration and description and is not intended to be exhaustive or to limit the invention to the precise forms disclosed. Numerous modifications and adaptations thereof will be apparent to those skilled in the art without departing from the spirit and scope of the invention.

That which is claimed is:

1. An apparatus comprising:
    a resonator comprising a base and a plurality of projections, a first projection of the plurality of projections having a first resonance frequency and a second projection of the plurality of projections having a second resonance frequency different from the first resonance frequency; and
    a piezoelectric actuator coupled to the resonator and operable to output a haptic feedback effect at the first resonance frequency and at the second resonance frequency.

2. The apparatus of claim 1, wherein each one of the plurality of projections comprises a physical property.

3. The apparatus of claim 2, wherein the physical property comprises a shape, a length, a width, a thickness, a surface, a material composition, or a material coating.

4. The apparatus of claim 2, wherein the physical property comprises an irregular surface, having a bump or defining a hole.

5. The apparatus of claim 1, wherein a physical property of the first projection comprises a first physical property and the second projection comprises a second physical property different from said first physical property.

6. The apparatus of claim 5, wherein the first physical property comprises a first length and wherein the second physical property comprises a second length different than the first length.

7. The apparatus of claim 1, wherein the first resonance frequency is not an integer multiple of the second resonance frequency.

8. The apparatus of claim 1, wherein the plurality of projections are coupled to the base.

9. The apparatus of claim 1, wherein the resonator comprises a first surface and a second surface and wherein the piezoelectric actuator comprises:
    a first piezoelectric actuator coupled to the first surface; and
    a second piezoelectric actuator coupled to the bottom surface.

10. The apparatus of claim 1, wherein the piezoelectric actuator is coupled to the resonator via an epoxy resin.

11. The apparatus of claim 1, wherein the piezoelectric actuator is coupled to the resonator via a flexible mounting.

12. The apparatus of claim 1, wherein the piezoelectric actuator is configured to:
    receive a haptic signal from a processor; and
    generate a haptic feedback effect at a resonance frequency of at least one of the plurality of projections in response to the signal.

13. An apparatus comprising:
    a resonator comprising:
        a base, having a first surface and a second surface;
        a first projection coupled to the base and having a first length and a first resonance frequency,
        a second projection coupled to the base and having a second length and a second resonance frequency, the second length different than the first length, the second resonance frequency different from the first resonance frequency;
        a third projection coupled to the base having a third length and a third resonance frequency, the third length different from the second length and different from the first length, the third resonance frequency different from the second resonance frequency and the first resonance frequency;
    a first piezoelectric actuator coupled to the first surface;
    a second piezoelectric actuator coupled to the second surface; and
    wherein the first piezoelectric actuator and the second piezoelectric actuator are configured to receive one or more haptic signals from a processor and to generate a haptic feedback effect at one or more of the first resonance frequency, the second resonance frequency, and the third resonance frequency.

14. The apparatus of claim 13, further comprising an input device in communication with the processor.

15. The apparatus of claim 14, wherein the apparatus comprise one of a mobile phone, mobile computer, a personal digital assistant (PDA), a portable media player, or a portable gaming device.

16. A method comprising:

receiving an input signal;

determining a haptic feedback effect based at least in part on the input signal;

selecting at least one projection of a plurality of projections of a resonator to output the haptic feedback effect based at least in part on a resonance frequency of the at least one projection; and generating a haptic signal configured to cause a piezoelectric actuator coupled to the resonator to generate a haptic feedback effect at the resonance frequency.

17. The method of claim 16, further comprising receiving the haptic signal and generating the haptic feedback effect.

18. The method of claim 16, wherein selecting at least one projection of a plurality of projections of a resonator comprises selecting a projection based at least in part on the haptic feedback effect to be output.

19. A non-transitory computer-readable medium on which is encoded processor-executable program code, the program code comprising:

program code to receive an input signal;

program code to determine a haptic feedback effect based at least in part on the input signal;

program code to determine at least one projection of a plurality of projections of a resonator to output the haptic feedback effect based at least in part on a resonance frequency of the at least one projection; and program code to generate a haptic signal configured to cause a piezoelectric actuator coupled to the resonator to generate a haptic feedback effect at the resonance frequency.

20. The non-transitory computer-readable medium of claim 19, wherein the program code to determine at least one projection of a resonator to output the haptic feedback effect comprises program code to select a projection based at least in part on the haptic feedback effect to be output.

* * * * *